United States Patent [19]
Oda

[11] Patent Number: 5,994,749
[45] Date of Patent: Nov. 30, 1999

[54] SEMICONDUCTOR DEVICE HAVING A GATE ELECTRODE FILM CONTAINING NITROGEN

[75] Inventor: Noriaki Oda, Tokyo, Japan

[73] Assignee: NEC Corporation, Tokyo, Japan

[21] Appl. No.: 09/008,941

[22] Filed: Jan. 20, 1998

[30] Foreign Application Priority Data

Jan. 20, 1997 [JP] Japan ................................... 9-007137

[51] Int. Cl.⁶ ...................... H01L 29/76; H01L 31/113
[52] U.S. Cl. ........................ 257/411; 257/760; 257/640
[58] Field of Search ................................. 257/411, 760, 257/407, 408, 410, 639, 640

[56] References Cited

U.S. PATENT DOCUMENTS

| | | | |
|---|---|---|---|
| 4,869,781 | 9/1989 | Euen et al. | 438/287 |
| 5,369,297 | 11/1994 | Kusunoki et al. | 257/411 |
| 5,459,688 | 10/1995 | Pfiester et al. | 257/69 |
| 5,516,707 | 5/1996 | Loh et al. | 438/302 |
| 5,525,541 | 6/1996 | Krauz et al. | 438/38 |
| 5,554,871 | 9/1996 | Yamashita et al. | 257/336 |
| 5,600,165 | 2/1997 | Tsukamoto et al. | 257/323 |
| 5,712,208 | 1/1998 | Tseng et al. | 438/770 |

FOREIGN PATENT DOCUMENTS

| | | | |
|---|---|---|---|
| 4-316370 | 11/1992 | Japan | 257/760 |
| 5283679 | 10/1993 | Japan | H01L 29/784 |
| 7176743 | 7/1995 | Japan | H01L 29/78 |

*Primary Examiner*—Jerome Jackson, Jr.
*Assistant Examiner*—George C. Eckert, II
*Attorney, Agent, or Firm*—Hayes Soloway Hennessey Grossman & Hage PC

[57] ABSTRACT

There is disclosed a semiconductor device which includes a semiconductor substrate having an element region and source and drain regions, a gate dielectric film containing nitrogen formed in the element region of said semiconductor substrate, a gate electrode formed on the gate dielectric film, a first dielectric film formed adjacent to the gate electrode so as to define a side wall therefor, a second dielectric film formed so as to cover the gate electrode and the first dielectric film, the second dielectric film being doped with nitrogen, and a third dielectric film formed so as to cover the second dielectric film, the third dielectric film being formed of silicon nitride. A method for manufacturing such a semiconductor device is also described.

7 Claims, 8 Drawing Sheets

1 : semiconductor substrate
4 : gate dielectric film
5 : gate electrode
6 : first dielectric film
7 : source and drain regions
8 : second dielectric film
9 : silicon nitride firm
10 : BPSG layer
14 : first layer wiring
15 : interlayer dielectric film
16 : via hole
17 : titanium nitride film
18 : tungsten
19 : second layer wiring
20 : cover firm 1 : semiconductor substrate
4 : gate dielectric film
5 : gate electrode
6 : first dielectric film
7 : source and drain regions
8 : second dielectric film
9 : silicon nitride firm
10 : BPSG layer
14 : first layer wiring
15 : interlayer dielectric film
16 : via hole
17 : titanium nitride film
18 : tungsten
19 : second layer wiring
20 : cover firm 1 : semiconductor substrate
4 : gate dielectric film
5 : gate electrode
6 : first dielectric film
7 : source and drain regions
8 : second dielectric film
9 : silicon nitride firm 1 : semiconductor substrate
4 : gate dielectric film
5 : gate electrode
7 : source and drain regions
8 : second dielectric film
9 : silicon nitride firm
10 : BPSG layer
14 : first layer wiring
15 : interlayer dielectric film
16 : via hole
17 : titanium nitride film
18 : tungsten
19 : second layer wiring
20 : cover firm
21 : silicon nitride firm

- 101 : semiconductor substrate
- 104 : gate oxide
- 105 : gate electrode
- 106 : first oxide film
- 107 : source and drain regions
- 108 : second oxide film
- 110 : BPSG layer
- 114 : first layer wiring
- 115 : interlayer dielectric film
- 116 : via hole
- 117 : titanium nitride film
- 118 : tungsten
- 119 : second layer wiring
- 120 : cover firm

FIG.6 (a) (Prior Art)
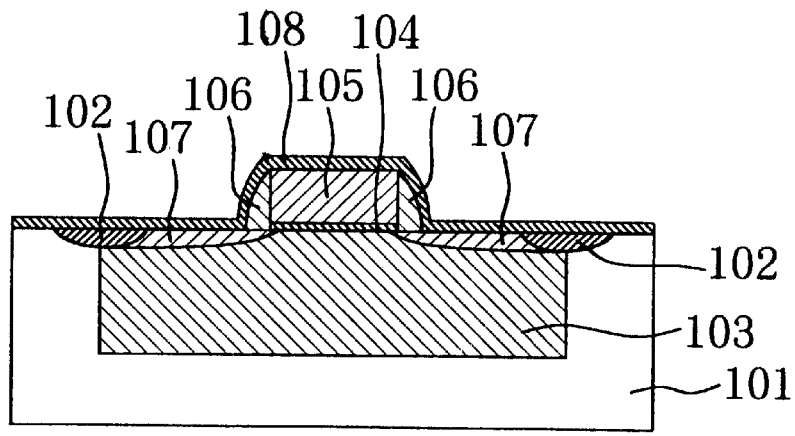
FIG.6 (b) (Prior Art)
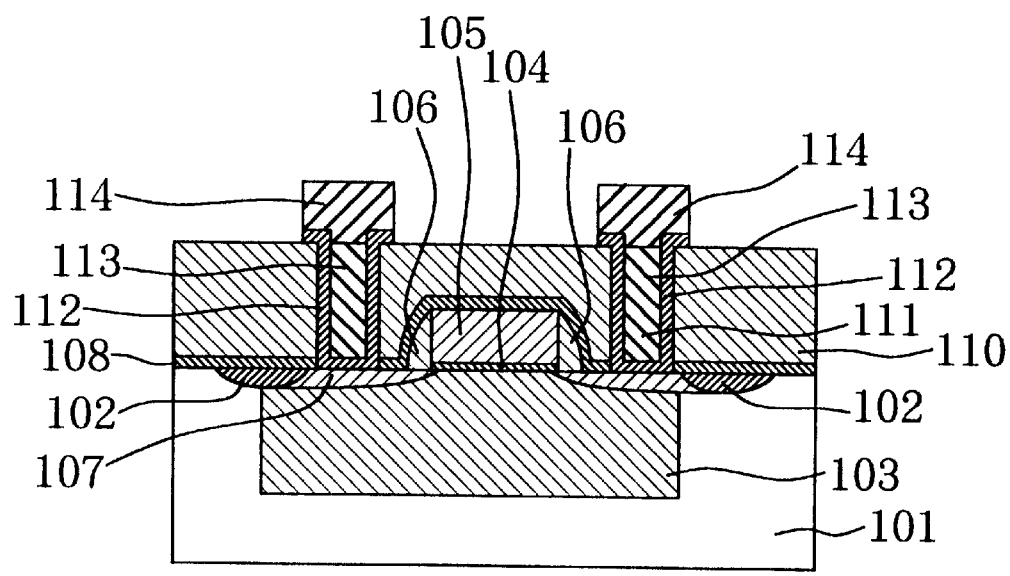
101 : semiconductor substrate
104 : gate oxide
105 : gate electrode
106 : first oxide film
107 : source and drain regions
108 : second oxide film 201 : semiconductor substrate
205 : gate electrode
206 : first oxide film
207 : source and drain regions
208 : second oxide film
221 : gate oxide film
222 : nitride oxide firm
223 : silicon oxide film 301 : semiconductor substrate
304 : gate oxide film
306 : first oxide film
307 : source and drain regions
308 : second oxide film
321 : doped region
322 : non − doped region

SEMICONDUCTOR DEVICE HAVING A GATE ELECTRODE FILM CONTAINING NITROGEN

BACKGROUND ART

1. Field of the Invention

The present invention pertains to a semiconductor device and a method for manufacturing the same, and more particularly to the improvement in the resistance to hot carriers and variation of characteristics due to slow-trapping in MOS-type semiconductor devices.

2. Related Art

FIG. 5 depicts an example of a conventional MOS-type semiconductor device, which comprises a semiconductor substrate 101 having isolation regions 102 formed thereon, a well region 103 formed at the areas other than the isolation regions 102, source and drain regions 107 formed in the vicinity of the substrate surface, a gate oxide 104 disposed above these regions, and a gate electrode 105 of polysilicon formed on the gate oxide 104. Formed at the lateral sides of the gate electrode 105 are first oxide films 106 defining side walls for the gate electrode 105, and a second oxide film 108 is formed as an interlayer dielectric film covering the entire surface, while a BPSG (boron-phosphorous silicate glass) layer 110 is further provided thereon. Furthermore, the second oxide film 108 and the BPSG layer 110 selectively have contact openings 111 in which a barrier metal 112 and tungsten 113 are embedded. Moreover, first layer wirings 114 each formed of an aluminum-including alloy are present at the regions which include at least the areas above the contact openings 111. An interlayer dielectric film 115 formed of SiOF is formed on the first layer wirings 114, and a via hole 116 is selectively opened therethrough. Formed at the side walls of the via hole 116 are titanium nitride films 117 extending from a second layer wiring 119, and tungsten 118 is embedded therein. Moreover, second layer wirings 119 are formed at the areas including a portion above the via hole 116, and a cover film 120 formed of a plasma SiON is present thereon.

The method for manufacturing this semiconductor device will now be described with reference to FIGS. 6(a) and 6(b).

First, as shown in FIG. 6(a), isolation regions 102 are formed on the semiconductor substrate 101 by means of a selective oxidation process, and a well region 103 is then formed by means of a conventional ion-implantation process. Thereafter, the surface of the semiconductor substrate 101 is subjected to oxidation to form a gate oxide 104, and after polysilicon is formed thereon, these are formed into a desired pattern to produce a gate electrode 105. Subsequently, an oxide film is caused to grow over the entire surface, and is subjected to an anisotropic etch-back working to leave a first oxide film 106 only at the lateral sides of the gate electrode 105. Then, source and drain regions 107 are formed by means of ion implantation and activation thermal annealing, and a second oxide film 108 is formed over the entire surface thereof so as to have a film thickness of about 100 nm.

Subsequently, as shown in FIG. 6(b), BPSG 110 is formed by means of an atmospheric CVD process so as to have a film thickness of around 1200 μm, and a surface thereof is polished by means of a CMP (chemical mechanical polishing) method to be flattened. Subsequently, after forming contact openings 111 selectively, a barrier metal 112 is provided, and the inside of each contact opening 111 is embedded with tungsten 113 deposited by CVD process, following which a first layer wiring 114 of an aluminum-containing alloy having a thickness of 0.4 μm is formed and subjected to patterning. Thereafter, an interlayer dielectric film of SiOF is formed by means of a bias ECR (electron cyclotron resonance) plasma CVD process so as to have a film thickness of 0.8 μm on the wiring. Further, a via hole 116 is selectively opened, and titanium nitride film 117 is deposited by a spattering method only with a small film thickness such as 50 nm, and tungsten 118 is deposited in the via hole 116 by a blanket CVD process, embedding the inside of the via hole 116 by effecting an etch-back working. Thereafter, a second layer wiring 119 is formed to effect a patterning, and a cover film 120 of SiON is finally deposited by means of a plasma CVD process so as to have a film thickness of about 1 μm.

In the semiconductor device of the aforesaid structure, however, BPSG is employed in order to ensure the flatness of the interlayer dielectric film, and a film, such as SiON, which is susceptible to the inclusion of water is used in order to reduce wiring volume. Therefore, there are problems of reliability, such as relatively poor resistance to hot carriers and variation of characteristics due to slow-trapping. Furthermore, the poor resistance to hot carriers and variation of characteristics due to slow-trapping will be more significant when dielectric films such as coated films having a further reduced dielectric constant are selected as the interlayer dielectric films in order to reduce the wiring time loss to obtain higher speed for circuit. This is because such an interlayer dielectric film is more susceptible to the inclusion of water.

In order to avoid such lowering of the reliability in MOS transistors, a technique which involves imparting resistance to the formation of surface level by incorporation of nitrogen in the gate oxide has been proposed. Referring to FIG. 7, the technique described in Japanese Patent Application, First Publication No. Hei 5-283679, will be explained for the purpose of illustration. This technique is similar to that described above in that isolation regions 202, a well region 203 and a gate electrode 205 are formed in or on a semiconductor substrate 201, and in that first oxide films 206 serving as side walls, source and drain regions 207 and a second oxide film 208 are formed. However, the gate oxide film 221 has a two-layered structure consisting of a nitride oxide film 222 containing no less than $10^{19}$ cm$^{-3}$ of nitrogen atoms and constituting an interface with the channel regions and a silicon oxide film 223 containing nitrogen atoms in a concentration of no greater than $10^{19}$ cm$^{-3}$ and disposed on the nitride oxide film 222. With this construction, the nitride oxide film 222 of higher nitrogen concentration provided at the interface of the low concentration region exhibits a high resistance to the formation of surface level due to drain-avalanche-hot carrier implantation, whereas the silicon oxide film 223 of a lower nitrogen concentration lowers the average concentration of the entire dielectric film, reduces the fixed charge, and reduces oxide film-trapping, so that electric field modulation at the low concentration regions can be prevented.

Furthermore, another conventional technique, proposed in Japanese Patent Application, First Publication No. Hei 7-176743 and shown in FIG. 8, is also similar in that isolation regions 302, a well region 303 and a gate oxide 304 are formed in or on a semiconductor substrate 301, and in that first oxide films 306 serving as side walls, source and drain regions 307 and a second oxide film 308 are formed. However, the gate oxide film 304 is doped with nitrogen, and includes, as the gate electrode, a region 321 which is doped with nitrogen and a region 322 which is not doped with nitrogen. Therefore, the resistance to hot carriers can be improved. In addition, it is possible to prevent impurities within the source and drain regions 307 from diffusing longitudinally and transversely by doping nitrogen within the source and drain regions 307.

Thus, with the conventional techniques described in these publications, it is possible to impart the resistance to the formation of surface level by incorporating nitrogen in the gate oxide and gate electrode. However, nitrogen leaves outwardly by diffusion from the gate oxide and the gate electrode during a thermal process mainly at a wiring process. As a result, the advantages expected by the incorporation of nitrogen reduce or even diminish, and a sufficient performance regarding the resistance to hot carriers and variation of characteristics due to slow-trapping cannot be obtained.

SUMMARY OF THE INVENTION

It is therefore an object of the present invention to provide a semiconductor device in which the aforesaid outward diffusion of nitrogen is prevented, and the improvement of the resistance to hot carriers and the reduction of variation of characteristics due to slow-trapping can be achieved as well.

Another object of the invention is to provide a method for manufacturing the aforesaid semiconductor device.

According to a first aspect of the present invention, there is provided a semiconductor device comprising:

- a semiconductor substrate having an element region and source and drain regions;
- a gate dielectric film containing nitrogen formed in the element region of the semiconductor substrate;
- a gate electrode formed on the gate dielectric film;
- a first dielectric film formed adjacent to the gate electrode so as to define a side wall therefor;
- a second dielectric film formed so as to cover the gate electrode and the first dielectric film, the second dielectric film being doped with nitrogen; and
- a third dielectric film formed so as to cover the second dielectric film, the third dielectric film being formed of silicon nitride.

In the foregoing, it is preferable that the first dielectric film be also doped with nitrogen. Furthermore, it is preferable that the first dielectric film be formed of silicon nitride.

According to a second aspect of the present invention, there is provided a method for manufacturing a semiconductor device, comprising the steps of:

- preparing a semiconductor substrate having an element region defined by an isolation region;
- forming a nitrogen-containing gate oxide and a conductive film successively on the element region and subjecting the films to an etching selectively to form a gate electrode;
- forming a first dielectric film entirely on the gate electrode and effecting an anisotropic etching to leave the first dielectric film only at a side wall of the gate electrode;
- implanting impurity into the semiconductor substrate to form source and drain regions;
- forming a second dielectric film so as to cover at least the gate electrode, the first dielectric film and the source and drain regions;
- implanting nitrogen ions into the second dielectric film; and
- forming a silicon nitride film on the second dielectric film.

In the foregoing, it is preferable that the step of forming a silicon nitride film may comprise forming the silicon nitride film by means of a low pressure chemical vapor deposition process. Furthermore, it is preferable that the step of forming a first dielectric film comprise forming a silicon oxide film by means of a chemical vapor deposition process.

In the above constructions and procedures, due to the nitrogen incorporated in the gate dielectric film, the hot carrier life of the MOS transistor can be prolonged, and the variation of characteristics due to slow-trapping can be reduced. In addition, inasmuch as the outward diffusion of nitrogen during the thermal annealing after the formation of the gate dielectric film is prevented by the second dielectric film or the third silicon nitride film, the improving effects of the characteristics as described above can be prevented from diminishing.

BRIEF DESCRIPTION OF THE DRAWINGS

These and other features, aspects, and advantages of the present invention will become better understood with regard to the following description, appended claims, and accompanying drawings where:

FIGS. 6(a) and 6(b) are views similar to FIGS. 2(a) and 2(b), but showing a method for manufacturing the semiconductor device of FIG. 5;

DETAILED DESCRIPTION OF THE PREFERRED EMBODIMENTS OF THE INVENTION

Figure 1:
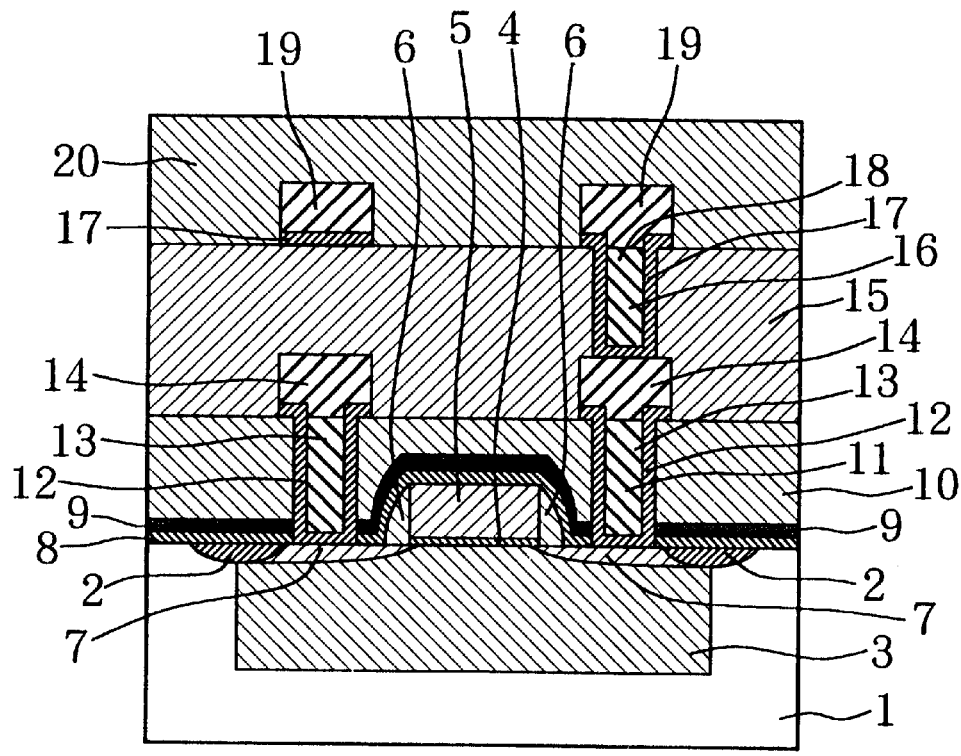
FIG. 1 is a schematic sectional view showing a semiconductor device in accordance with a first embodiment of the present invention.

FIG. 1 is a cross sectional view depicting a semiconductor device in accordance with a first embodiment of the present invention.

The semiconductor device comprises a semiconductor substrate 1 of silicon or the like having isolation regions 2 of silicon oxide films formed thereon, a well region 3 formed at the areas other than the isolation regions 2, and source and drain regions 7 formed in the well region 3 so as to be adjacent to the substrate surface. A gate dielectric film 4 of silicon oxide having a film thickness of, for example, 5 nm is present on these diffusion layers, and a gate electrode 5 of polysilicon having a film thickness of, for example, 200 nm is formed on this gate oxide 4. Formed at the lateral sides of the gate electrode 5 are first dielectric films 6 of silicon oxide defining side walls for the gate electrode 5. In the foregoing, the gate dielectric film 4 is doped with nitrogen in an amount of $3\times10^{18}$–$7\times10^{18}$ cm$^{-3}$ (preferably about $5\times10^{18}$ cm$^{-3}$), whereas the first dielectric film 6 is doped with nitrogen in an amount of $5\times10^{18}$–$5\times10^{19}$ cm$^{-3}$ (preferably about $10^{19}$ cm$^{-3}$). Furthermore, a second dielectric film 8 of silicon oxide is formed on the gate electrode 5, the source and drain regions 7 and the isolation regions 2 so as to cover the same. The second dielectric film 8 has a film thickness of about 100 nm, and is doped with nitrogen in a desired concentration.

Moreover, a silicon nitride film 9 having a film thickness of 10 nm, for example, and serving as a third dielectric film, as well as a BPSG layer 10 having a film thickness of about 700 nm are formed on the second dielectric film 8. The second dielectric film 8, the silicon nitride film 9 and the BPSG layer 10 selectively have contact openings 11 in which a barrier metal 12 extending to the top of the BPSG layer 10 and tungsten 13 are embedded. The barrier metal 12 is comprised of, for example, titanium having a film thickness of 30 nm from the lower layer and titanium nitride having a film thickness of 100 nm. Furthermore, first layer wirings 14 each formed of an aluminum-including alloy and having a film thickness of 500 nm are present at the regions which include at least the areas above the contact openings 11. An interlayer dielectric film 15 formed of SiOF so as to have a film thickness of 0.8 $\mu$m is formed on the first layer wirings 14, and a via hole 16 is selectively opened therethrough. Formed at the side walls of the via hole 16 are titanium nitride films 17 having a film thickness of for example 100 nm and extending from the surface of the interlayer dielectric film 15, and tungsten 18 is embedded so as to fill the remaining space within the via hole 16. Moreover, second layer wirings 19 are formed at the areas including at least the portion above the via hole 16. This embodiment is illustrated for the case of two-layer wiring, but the wiring structure may be of a type having more layers. Furthermore, a cover film 20 of a plasma SiON having a film thickness of 1 $\mu$m is formed on the uppermost second layer wiring 19.

The fabrication procedural steps for the semiconductor device of FIG. 1 will now be described with reference to FIGS. 2(a) and 2(b).

First, as shown in FIG. 2(a), after isolation regions 2 are formed on a semiconductor substrate 1 by effecting a selective oxidation to the substrate surface, a well region 3 is formed in the areas other than the isolation regions 2. Thereafter, a silicon oxide film is caused to grow on the areas forming MOS transistor to form a gate dielectric film 4, and nitrogen ions are implanted on the gate dielectric film 4. Further, polysilicon is formed on the gate dielectric film 4, and a selective etching is effected thereon such that the polysilicon remains only at the desired areas to thereby produce a gate electrode 5. Subsequently, a first dielectric film 6 of a silicon oxide film is formed on the entire surface by means of a CVD process, and is subjected to an anisotropic etch-back working to leave the first dielectric films 6, as side walls, only at the lateral sides of the gate electrode 5. Then, source and drain regions 7 are formed by effecting an ion implantation while permitting the gate electrode 5 and the first dielectric films 6 remaining at the lateral sides of the gate electrode 5 to serve as a part of mask, and subjected to thermal annealing for activation. Furthermore, a silicon oxide film is deposited by means of a CVD process to form a second dielectric film 8 over the entire surface thereof so as to have a film thickness of about 100 nm. The conditions of the ion-implantation for the formation of the source and drain regions 7 are for example such that, for N-type MOS transistors, arsenic is used at 30 keV and $3 \times 10^{15}$ cm$^{-2}$, whereas, for P-type MOS transistors, BF$_2$ is implanted at 20 keV and $3 \times 10^{15}$ cm$^{-2}$.

Figure 2:
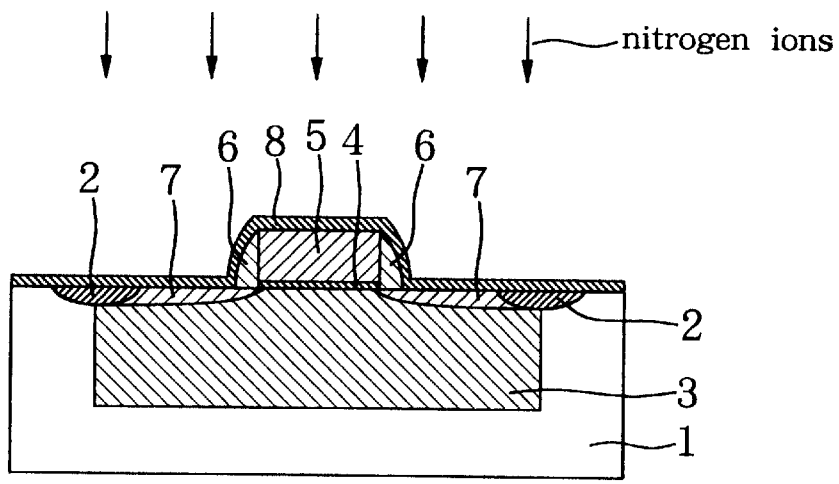
FIGS. 2(a) and 2(b) are schematic sectional views for showing a manufacturing method of the semiconductor device of FIG. 1.
Figure 2:
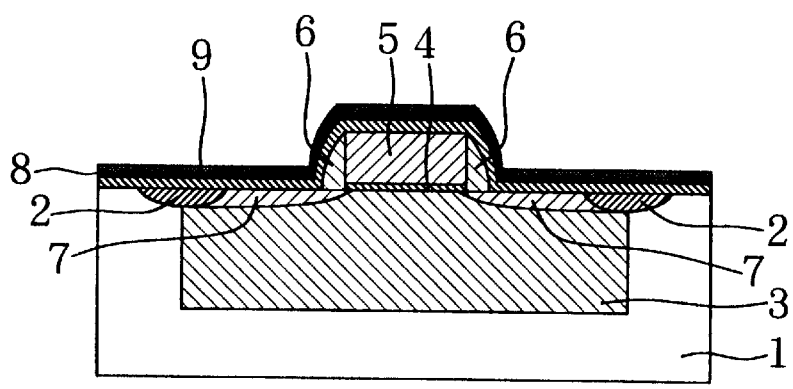

Thereafter, as shown in FIG. 2 (b), a silicon nitride film 9 is formed as a third dielectric film on the second dielectric film 8 so as to have a film thickness of about 10 nm, and BPSG is deposited thereon so as to have a film thickness of 1600 nm, and the film thickness of all the interlayer dielectric films is adjusted by means of a CMP process to about 0.8 $\mu$m. The silicon nitride film 9 is formed by means of an LPCVD process employing a gaseous mixture of SiH$_4$ and NH$_3$ at 700° C.

Subsequently, as already depicted in FIG. 1, contact openings 11 are selectively formed, and a barrier metal of titanium nitride having a film thickness of 100 nm is deposited therein by a spattering process, and tungsten 13 is deposited on the entire surface by means of CVD process, and is left by an etch-back working only inside the contact openings 11. Further, an aluminum-containing alloy is deposited on the entire surface so as to have a film thickness of 500 nm for example, and the aluminum-containing alloy is left by means of photolithography process and reactive ion-etching at the areas which includes at least the portion above the contact openings 11 to produce a first layer wiring 14. A SiOF layer having a film thickness of about 1600 nm is formed on the entire surface including this first layer wiring 14 by means of a bias ECR plasma CVD process, and is subjected to CMP process to form an interlayer dielectric film 15, which has a film thickness of 0.8 $\mu$m on the wiring. Further, a via hole 16 is selectively opened in the interlayer dielectric film 15, and titanium nitride film 17 having a film thickness of 100 nm for example is deposited by a sputtering process. And, tungsten 18 is deposited on the entire surface by a CVD process, and an etch-back working is effected to leave the tungsten 18 only inside the via hole 16. Thereafter, an aluminum-containing alloy is deposited by a sputtering process so as to have a film thickness of 500 nm for example, and is left at desired areas to provide a second layer wiring 19. A cover film 20 of plasma SiON having a film thickness of 1 $\mu$m is formed on this second layer wiring 19.

Figure 3:
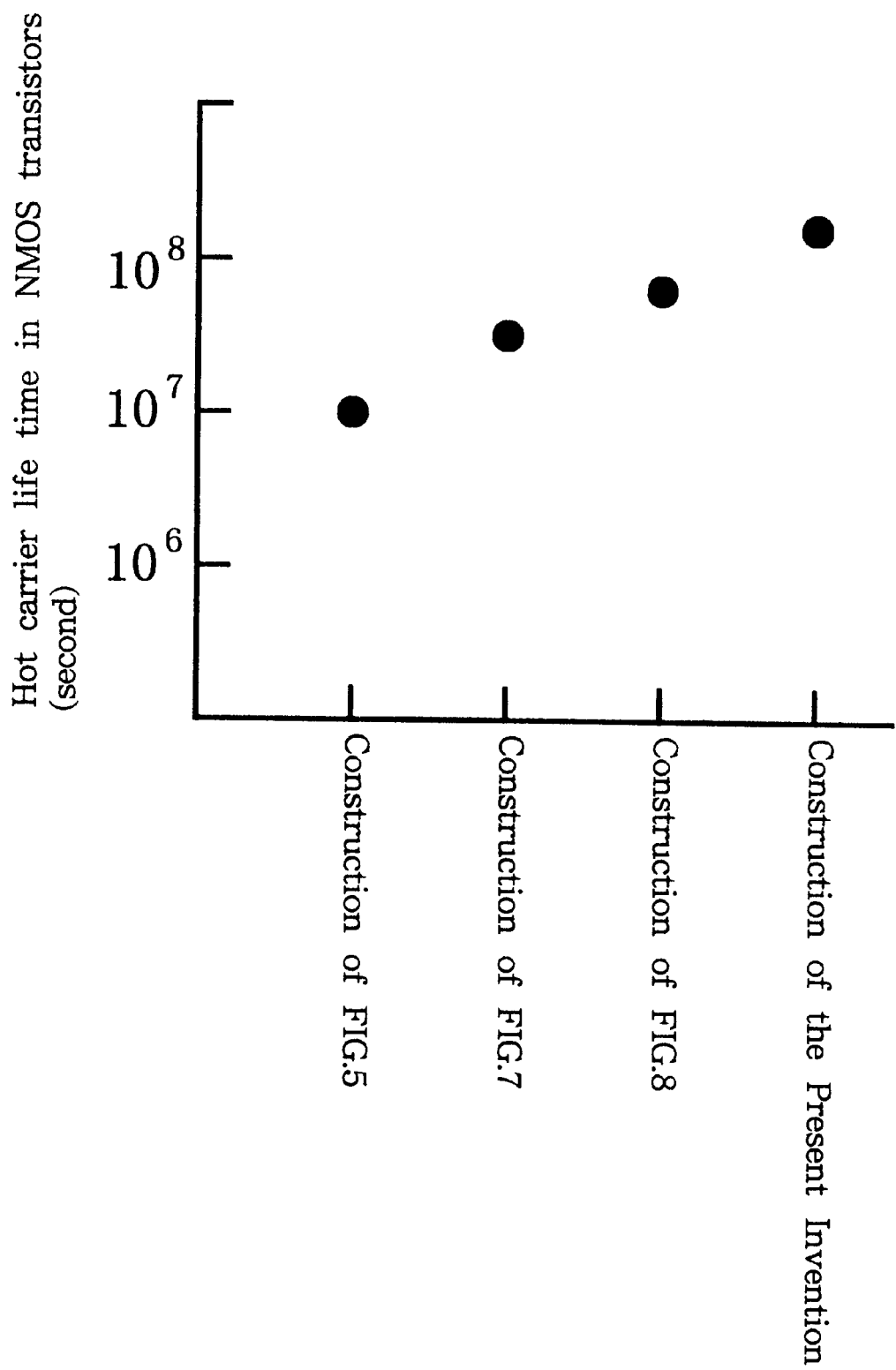
FIG. 3 is a graphical representation showing the advantages of the first embodiment of FIG. 1.
Figure 5:
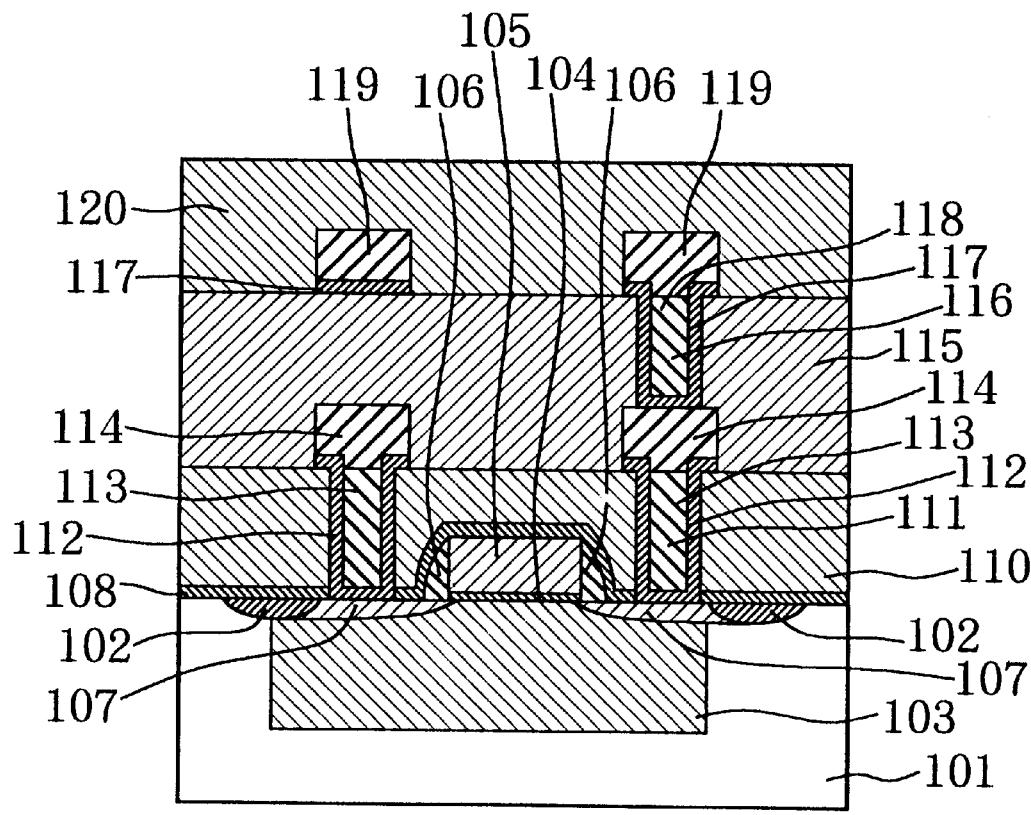
FIG. 5 is a sectional view similar to FIG. 1, but showing an example of a conventional semiconductor device.
Figure 7:
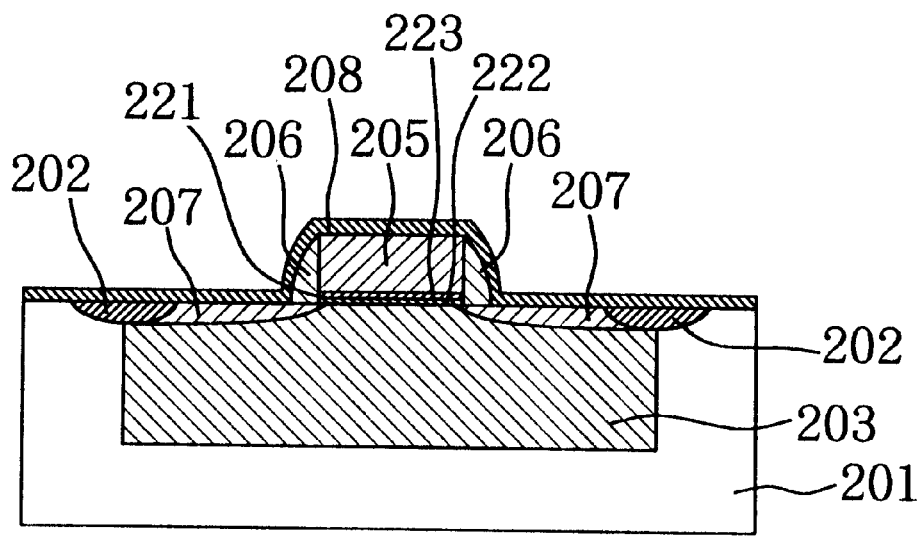
FIG. 7 is a view similar to FIG. 5, but showing another conventional semiconductor device.
Figure 8:
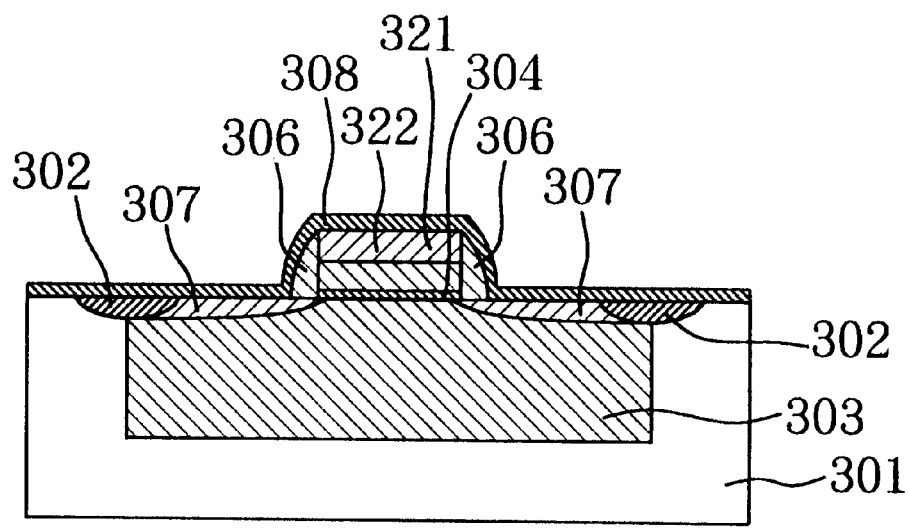
FIG. 8 is a view similar to FIG. 5, but showing yet another conventional semiconductor device.
Figure 8:
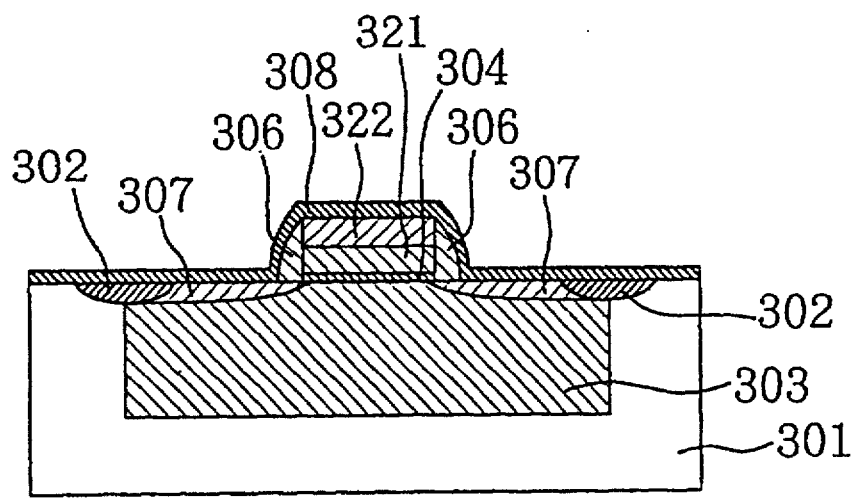

In the semiconductor device in accordance with the embodiment of FIG. 1, the first dielectric film 6 present at the lateral sides of the gate electrode 5 are doped with nitrogen, and the second dielectric film 8 and the silicon nitride film 9 covering the entire surface are present. Therefore, nitrogen, incorporated into the gate dielectric film 4, is prevented from diffusing outwardly during the thermal annealing at the wiring process, thereby avoiding dilution of nitrogen. Accordingly, the prolongation of hot carrier life as well as the suppression of the variation of transistor characteristics due to slow-trapping can be achieved. These advantages will be exemplified with reference to FIG. 3, which compares the hot carrier lives in N-type MOS transistors for the structure of the invention and the conventional structures of FIGS. 5, 7 and 8. For the N-type MOS transistor used for the measurement, the gate length, the gate width and the film thickness of the gate dielectric film were 0.2 $\mu$m, 10 $\mu$m and 5 nm, respectively, and LDD (lightly doped drain) was formed at the end of drain. As can be seen from the results, the structure of the invention exhibits about 20% improvement in hot carrier life as compared with the structure of FIG. 8, which showed the best hot carrier resistance among the conventional structures. The reason is that, due to the provision of the nitrogen-containing silicon oxide film 8 as the second dielectric film and of the silicon nitride film 9 as the third dielectric film, the nitrogen doped is prevented from diffusing outwards at a subsequent thermal annealing step.

Figure 4:
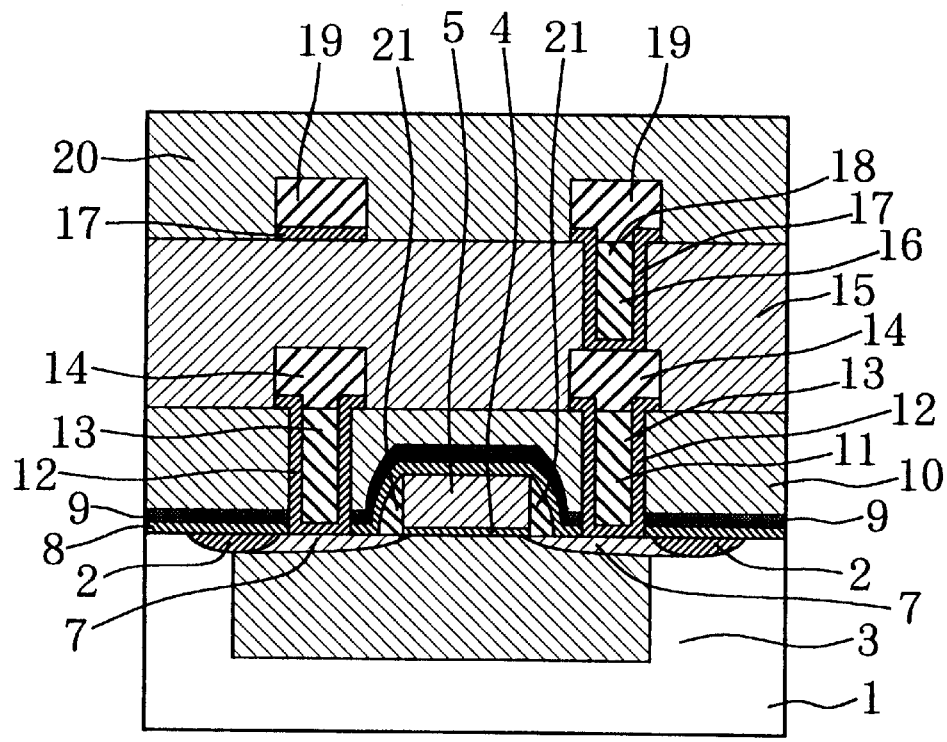
FIG. 4 is a sectional view similar to FIG. 1, but showing a semiconductor device in accordance with a second embodiment of the present invention.

FIG. 4 is a cross-sectional view of a second embodiment in accordance with the present invention which is characterized in that the first dielectric film serving as side walls formed at the lateral sides of the gate electrode 5 are formed of silicon nitride films 21. In this embodiment, inasmuch as the side walls at the lateral sides of the gate electrode 5 are constituted by the silicon nitride films 21, the function of the first dielectric film to prevent the nitrogen incorporated inside the gate dielectric film 4 from diffusing outwards is enhanced, and the prolongation of hot carrier life as well as the reduction of variation of transistor characteristics due to slow-trapping can be achieved more positively.

Obviously, many modifications and variations are possible in the light of the foregoing teachings. It is thus to be understood that within the scope of the appended claims, the invention may be practiced otherwise than as specifically described.

Finally, the present application claims the priority of Japanese Patent Application No. Hei9-007137 filed Jan. 20, 1997, which is herein incorporated by reference.

What is claimed is:

1. A semiconductor device comprising:
   a semiconductor substrate having an element region and source and drain regions;
   a gate dielectric film containing nitrogen formed in said element region of said semiconductor substrate;
   a gate electrode formed on said gate dielectric film;
   a first dielectric film formed adjacent to said gate electrode so as to define a side wall therefor, said first dielectric film containing nitrogen in a concentration greater than that of said gate dielectric film;
   a second dielectric film formed so as to cover said gate electrode, said source and drain regions and said first dielectric film, said second dielectric film also containing nitrogen; and
   a third dielectric film formed so as to cover said second dielectric film and said underlying first dielectric film and source and drain regions, said third dielectric film being formed of silicon nitride.

2. A semiconductor device as recited in claim 1, wherein said first dielectric film is doped with nitrogen.

3. A semiconductor device as recited in claim 2, wherein said first dielectric film is formed of silicon nitride.

4. A semiconductor device comprising, in combination:
   a semiconductor substrate having an element region and source and drain regions;
   a gate dielectric film containing nitrogen in an amount of $3 \times 10^{18} - 7 \times 10^{18}$ cm$^{-3}$ formed in said element region of said semiconductor substrate;
   a gate electrode formed on said gate dielectric film;
   a first dielectric film formed adjacent to said gate electrode so as to define a side wall therefor, said first dielectric film containing nitrogen in an amount of $5 - \times 10^{18} - 5 \times 10^{19}$ cm$^{-3}$;
   a second dielectric film formed so as to cover said gate electrode and said first dielectric film, said second dielectric film also containing nitrogen; and
   a third dielectric film formed so as to cover said second dielectric film, said third dielectric film being formed of silicon nitride.

5. A semiconductor device as recited in claim 4, wherein said first dielectric film contains nitrogen in an amount of about $10^{19}$ cm$^{-3}$.

6. A semiconductor device as recited in claim 5, wherein said first dielectric film is formed of silicon nitride.

7. A semiconductor device as recited in claim 4, wherein said gate dielectric film contains nitrogen in the amount of about $5 \times 10^{18}$ cm$^{-3}$.

* * * * *

UNITED STATES PATENT AND TRADEMARK OFFICE
CERTIFICATE OF CORRECTION

PATENT NO. : 5,994,749
DATED : November 30, 1999
INVENTOR(S) : Oda

It is certified that error appears in the above-identified patent and that said Letters Patent is hereby corrected as shown below:

Replace Drawing sheet 8 with the attached new Drawing sheet.

Signed and Sealed this

Eighteenth Day of September, 2001

Attest:

NICHOLAS P. GODICI
Attesting Officer  Acting Director of the United States Patent and Trademark Office 301 : semiconductor substrate
304 : gate oxide film
306 : first oxide film
307 : source and drain regions
308 : second oxide film
321 : doped region
322 : non − doped region